(12) United States Patent
Yeh et al.

(10) Patent No.: US 9,748,156 B1
(45) Date of Patent: Aug. 29, 2017

(54) SEMICONDUCTOR PACKAGE ASSEMBLY, SEMICONDUCTOR PACKAGE AND FORMING METHOD THEREOF

(71) Applicant: TAIWAN SEMICONDUCTOR MANUFACTURING CO., LTD., Hsinchu (TW)

(72) Inventors: Shu-Shen Yeh, Taoyuan (TW); Cheng-Lin Huang, Hsinchu (TW); Chin-Hua Wang, New Taipei (TW); Kuang-Chun Lee, New Taipei (TW); Wen-Yi Lin, New Taipei (TW); Ming-Chih Yew, Hsinchu (TW); Yu-Huan Chen, Taoyuan (TW); Po-Yao Lin, Hsinchu County (TW); Shyue-Ter Leu, Hsinchu (TW); Shin-Puu Jeng, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/180,264

(22) Filed: Jun. 13, 2016

(51) Int. Cl.
| | |
|---|---|
| H01L 23/48 | (2006.01) |
| H01L 23/52 | (2006.01) |
| H01L 29/40 | (2006.01) |
| H01L 23/18 | (2006.01) |
| H01L 25/10 | (2006.01) |
| H01L 25/00 | (2006.01) |

(52) U.S. Cl.
CPC ............ *H01L 23/18* (2013.01); *H01L 25/105* (2013.01); *H01L 25/50* (2013.01); *H01L 2225/1058* (2013.01); *H01L 2225/1076* (2013.01)

(58) Field of Classification Search
CPC ............... H01L 25/043; H01L 25/0657; H01L 25/0756; H01L 25/117; H01L 25/0652; H01L 25/071; H01L 25/074; H05K 2201/10515
USPC .................. 257/686, 777, E23.085; 438/109
See application file for complete search history.

(56) References Cited

U.S. PATENT DOCUMENTS

| | | | |
|---|---|---|---|
| 8,643,163 B2* | 2/2014 | Shim ..................... | H01L 23/552 257/686 |
| 2014/0061877 A1* | 3/2014 | Lin ......................... | H01L 24/82 257/659 |

* cited by examiner

*Primary Examiner* — Sonya D McCall Shepard
(74) *Attorney, Agent, or Firm* — McClure, Qualey & Rodack, LLP

(57) ABSTRACT

A semiconductor package includes a cover, a substrate, at least one semiconductor device and at least one corner stiffener. The cover has at least one corner portion. The substrate is in force communication with the cover. The substrate has at least one corner portion. The semiconductor device is present between the cover and the substrate. The corner stiffener is present on at least one of the corner portion of the cover and the corner portion of the substrate.

20 Claims, 6 Drawing Sheets

SEMICONDUCTOR PACKAGE ASSEMBLY, SEMICONDUCTOR PACKAGE AND FORMING METHOD THEREOF

BACKGROUND

Package on Package (POP) technology is an integrated circuit packaging technique to allow vertical combination of multiple packages, e.g., discrete logic and memory ball grid array (BGA) packages. Two or more packages are mounted on top of one another, i.e. stacked, with an electrical interface to route electrical signals between them. This allows higher density integrated circuit chips usable in mobile devices, for example in mobile telephones or tablet computers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
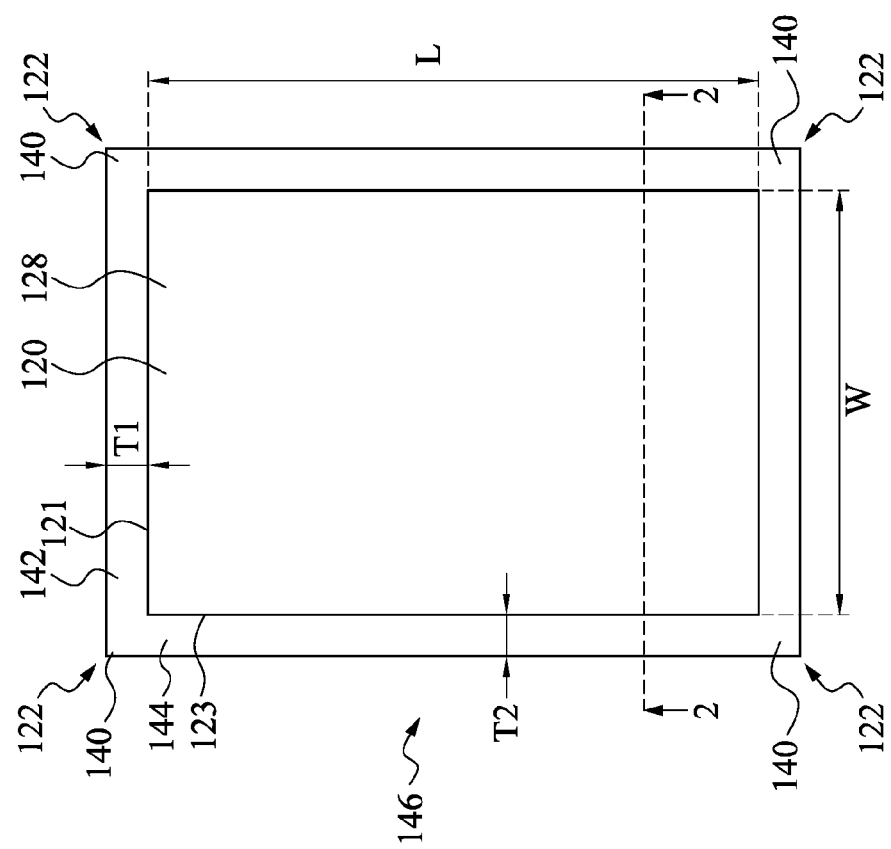
FIG. 1 is a top view of a semiconductor package assembly in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
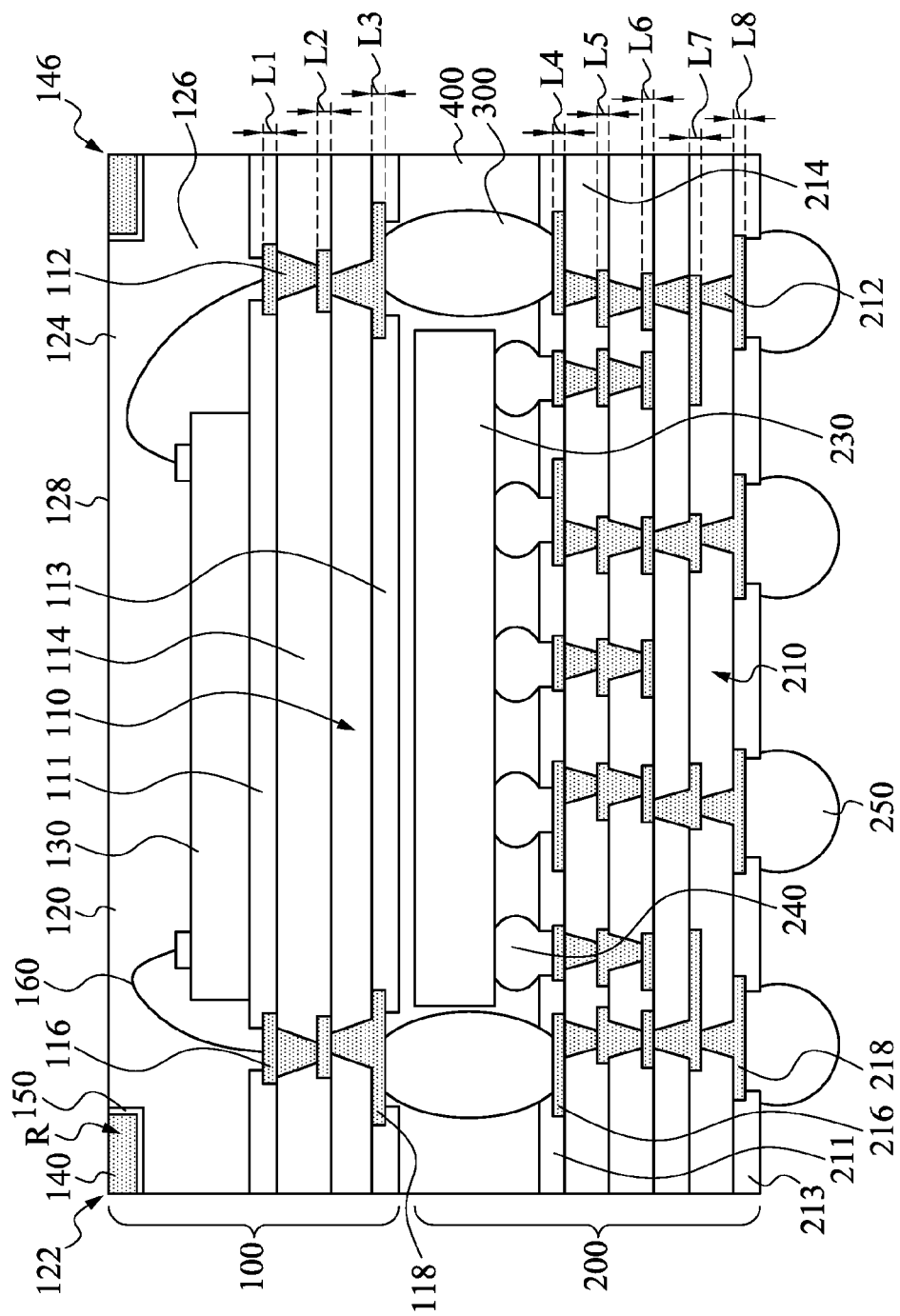
FIG. 2 is a cross-sectional view of the semiconductor package assembly taken along line 2 in FIG. 1.

FIG. 1 is a top view of a semiconductor package assembly in accordance with some embodiments of the present disclosure. FIG. 2 is a cross-sectional view of the semiconductor package assembly taken along line 2 in FIG. 1. The semiconductor package assembly may be a package on package (PoP) structure that includes an upper semiconductor package 100 and a lower semiconductor package 200. The upper semiconductor package 100 is present on and in force communication with the lower semiconductor package 200. For example, the semiconductor package assembly may include connectors 300 to mechanically connect the upper and lower semiconductor packages 100 and 200, so that the connectors 300 are in force communication with the upper and lower semiconductor packages 100 and 200. That is, a force exerted upon the upper semiconductor package 100 may affect the lower semiconductor package 200, and a force exerted upon the lower semiconductor package 200 may affect the upper semiconductor package 100 as well.

In some embodiments, these connectors 300 may be solder or other conductive materials, which may provide electrical connections to the upper and lower semiconductor packages 100 and 200. The connectors 300 may be solder balls, as shown in FIG. 2, but the embodiments are not limited to the use of solder balls, the connectors could be copper columns, copper studs, controlled collapse chip connectors ("C4"), or other connectors used for connecting components to an underlying board or device. Further, the term "solder" as used in this description is not limited to any particular type and lead containing, or lead free, solder may be used. A solder ball of lead and tin (Pb/Sn) or Pb and additional materials may be used. In the alternative, lead free compositions including, as a non-limiting example, tin, silver and copper ("SAC") may be used. Eutectic compositions may be used to form the connectors 300. The shape of the connectors 300 is also not limited to a "ball" shape and columns, pillars, ovoids, towers, squares, rectangles and other shapes may be used.

In some embodiments, the connectors 300 may be arranged in rows at the peripheries of the upper and lower semiconductor packages 100 and 200. This arrangement leaves space in the central portion of the bottom surface of the upper semiconductor package 100 for a semiconductor device mounted beneath it to be placed inside the vertical space provided by the connectors 300, and adjacent to the bottom surface of the upper semiconductor package 100. In this manner, the thickness of the PoP structure can be reduced.

In some embodiments, the lower semiconductor package 200 may be a ball grid array (BGA) package, and the upper semiconductor package 100 is present on or mounted on the BGA package in the PoP structure. In some embodiments, the PoP structure can be mounted on a system board (not shown). The system board may be, for example, a printed circuit board. The PoP structure may be mounted using the ball connectors to couple to lands on the system board in a thermal reflow process. In the reflow process, the BGA balls are first placed in alignment with the lands on the system board which are formed in a correspondence to the BGA balls, the PoP structure is moved to put the BGA balls in contact with the lands on the system board, and a thermal process is used to cause the BGA balls to melt and reflow and mechanically bond with the circuit board, completing both an electrical and a mechanical connection of the PoP structure to the circuit board. In some embodiments, adhesives may be used to further add mechanical strength, and an underfill material may be used to provide stress relief to the connection between the PoP structure and the system board.

As the number of input and output connections for semiconductor devices of the upper and lower semiconductor packages 100 and 200 increases, the use of these semiconductor devices in the PoP structure results in thicker structures. As the PoP structure gets thicker, the distance of the path from the semiconductor device on the upper semiconductor package 100 to the system board increases. An exemplary signal path may include a bonding wire, a bonding pad on the upper semiconductor package 100, a conductive via embedded in the upper semiconductor package 100, a solder ball or copper column connector to the lower semiconductor package 200, a solder bump and solder pad to a semiconductor device on the lower semiconductor package 200, another conductive via and another solder ball to the system circuit board. This path may have significant voltage drop from the current-resistance ("IR") in the path. Also, the package height may become an issue in designing very thin, hand held and portable devices where a thinner package is desired.

In some embodiments, the upper semiconductor package 100 includes a substrate 110. This substrate 110 may be or include a coreless substrate, including one or more conductive layers formed on one or both sides of a dielectric layer. Such a substrate 110 without core may reduce the thickness of the substrate 110, which may reduce the voltage drop from the current-resistance in the current flow path and benefit thinning the upper semiconductor package 100 as well. The coreless substrate 110 has layers of dielectric material separating conductive layers to form a multiple layer circuit board. For example, the coreless substrate 110 may include a plurality of conductive layers L1, L2 and L3 and a plurality of conductive vias 112, and a plurality of dielectric layers 114. The dielectric layers 114 are vertically arranged, and the conductive layers L1, L2 and L3 are vertically arranged and spatially separated by the dielectric layers 114. The conductive vias 112 respectively penetrate through the vertically arranged dielectric layers 114, so that the conductive layers L1, L2 and L3 can be electrically interconnected through the conductive vias 112. By such a configuration, bonding pads 116, which are portions of the conductive layer L1, are connected to the conductive traces 118, which are portions of the conductive layer L3. The upper conductive via 112 electrically interconnects and may be in physical contact with the conductive layers L1 and L2. Similarly, the lower conductive via 112 electrically interconnects and may be in physical contact with the conductive layers L2 and L3. The conductive vias 112 may be formed as conductive pipes in some exemplary embodiments. The internal volumes of conductive vias 112 formed as the conductive pipes may be filled with dielectric filling, which may be a material selected from substantially the same candidate materials for forming the dielectric layers 114. In alternative embodiments, conductive vias 112 formed as pipes may include air gaps therein. Such conductive vias 112 vertically coupling the conductive layers L1, L2 and L3 may be used to provide routing and mapping connections. The conductive vias 112 may be used to provide a vertical path for a signal through the substrate 110.

In some embodiments, the conductive layers L1, L2, L3 and the conductive vias 112 may include, but are not limited to, copper, aluminum, nickel, gold, or combinations thereof. In some embodiments, the dielectric layers 114 may include, but are not limited to, polypropylene (PP), polyethylene (PE), polymethyl methacrylate (PMMA), polyethylene terephthalate (PET), polycarbonates (PC), polyphenylene sulfide (PPS) or combinations thereof. Since the substrate 110 has no core therein, the thickness thereof can be reduced, and the path for the signal transmission can be shortened.

The upper semiconductor package 100 further includes a cover 120 and a semiconductor device 130. The semiconductor device 130 is present between the cover 120 and the substrate 110. The substrate 110 is in force communication with the cover 120. For example, the cover 120 covers the semiconductor device 130 and may be in physical contact with the substrate 110 underlying the semiconductor device 130, so that a force exerted upon the cover 120 affects the substrate 110, and vice versa. The cover 120 may be an overmolding layer formed, for example, by compression molding of a thermoset molding compound, to protect the semiconductor device 130 and other component underlying the cover 120 from moisture and thermal stresses. Other overmolding materials may be used such as resins and epoxies.

The upper semiconductor package 100 may include at least one corner stiffener 140. The cover 120 has at least one corner portion 122. The corner stiffener 140 is stiffer than the corner portion 122 of the cover 120. In other words, the corner stiffener 140 has stiffness greater than that of the corner portion 122. By using such a configuration, the upper semiconductor package 100 can be stiffened to have high enough stiffness even if the substrate 110 of the upper semiconductor package 100 is coreless in some embodiments. In other words, even if the coreless substrate 110 has low stiffness due to absence of the core, the corner stiffener 140 can stiffen the upper semiconductor package 100, thereby alleviating warpage of the PoP structure. More particularly, the corner stiffener 140 can exert a force to the corner portion 122 against warpage of the cover 120, and such a force may also resist warpage of the substrate 110 since the substrate 110 and the cover 120 are in force communication with each other. Accordingly, warpage of the PoP structure can be alleviated due to presence of the corner stiffener 140.

More particularly, in some embodiments, the cover 120 includes surfaces non-parallel to each other, such as surfaces 121 and 123, as shown in FIG. 1. The corner portion 122 is a place where the non-parallel surfaces of the cover 120 meet. The corner stiffener 140 is present on the corner portion 122 of the cover 120. For example, one corner stiffener 140 has portions 142 and 144 that are respectively present on the non-parallel surfaces 121 and 123, and these portions 142 and 144 of the corner stiffener 140 may be connected, adjoined or integrally formed. By such a configuration, the corner stiffener 140 may stiffen the PoP structure.

In some embodiments, as shown in FIG. 1 and FIG. 2, there are plural corner stiffeners 140, and these corner stiffeners 140 are connected to form a ring 146 that surrounds at least a portion of the cover 120. For example, the cover 120 includes an upper portion 124 distal to the substrate 110 and a lower portion 126 proximal to the substrate 110. The upper portion 124 can be surrounded by the ring 146 formed by the corner stiffeners 140, so that the stiffness of PoP structure can be further improved. In some embodiments, as shown in FIG. 2, the cover 120 has at least one recess R thereon, and the corner stiffener 140 is present in the recess R. More particularly, the cover 120 has a top surface 128 distal to the substrate 110. The recess R is formed on or recessed on the top surface 128 of the cover 120. The recess R may be filled with the corner stiffener 140. In other words, the corner stiffener 140 may conformally fit with the recess R. In some embodiments, the recess R may be annular-shaped, so as to benefit the ring 146 formed by the corner stiffeners 140 to conformal fit with the recess R. In other words, the cover 120 may have an annular recess R thereon, and the ring 146 formed by the corner stiffeners 140 fills the annular recess R, which may benefit the stiffening of the upper semiconductor package 100. In some embodiments, the recession of the cover 120 makes the upper portion 124 of the cover 120 shrink with respect to the lower portion 126 of the cover 120. In other words, the lower portion 126 may be wider than the upper portion 124, so that the lower portion 126 can spatially separate the overlying corner stiffener 140 and the underlying substrate 110. In some other embodiments, the recession of the cover 120 exposes a portion of the substrate 110, and the cover 120 is absent between the corner stiffener 140 and the substrate 110. In some embodiments, the corner stiffener 140 is adhered to the cover 120. More particularly, the corner stiffener 140 is adhered to surfaces of the recess R. For example, the upper semiconductor package 100 may include an adhesive 150 present between the corner stiffener 140 and the surfaces of the recess R, so that the adhesive 150 adheres the corner stiffener 140 to the recess R of the cover 120.

In some embodiments, the cover 120 is a molding compound. For example, the cover 120 may be a molding compound including polonium (Po) and platinum (Pt). The corner stiffener 140 has the stiffness greater than that of the molding compound. For example, the corner stiffener 140 may be a conductive structure present in the recess R of the molding compound, and a stiffness of the conductive structure is greater than that of the molding compound. The conductive structure may exemplarily include copper, aluminum, nickel, gold, or combinations thereof. In some other embodiments, the corner stiffener 140 may include a ceramic material that is stiffer than the molding compound. Since the conductive structure or the ceramic material present on the corner portion 122 of the molding compound is stiffer than the molding compound, the conductive structure can stiffen the upper semiconductor package 100, thereby alleviating warpage of the PoP structure. In some embodiments, the molding compound is initially in a liquid form and is dried after being dispensed on the semiconductor device 130 to cover the entire semiconductor device 130. For example, the molding compound may initially include an epoxy, a filler, solvent or other suitable material. In some embodiments, the molding compound may be formed by transfer molding, where a measured molding material (may be a thermoset plastic) is pre-heated to a liquid form before being applied on the substrate 110 and the semiconductor device 130. The molding material is heated after being applied to finalize the molding process. Various resins may be used as the materials of the molding compound.

In some embodiments, the conductive structures serving as the corner stiffeners 140 do not provide electrical connection to the semiconductor device 130. In other words, the corner stiffeners 140 may be insulated from the semiconductor device 130. For example, the corner stiffeners 140 and the semiconductor device 130 may be insulated by the cover 120, such as the molding compound. Moreover, in some embodiments, the corner stiffeners 140 and the conductive layers L1 to L3 of the substrate 110 may be insulated by the cover 120 as well. In other words, the corner stiffeners 140 made of the conductive material may not provide electrical connection to the PoP structure. In some embodiments, the corner stiffeners 140 may be electrically connected to a ground (not shown) of the PoP structure, so that some electric issues, such as electrostatic discharge (ESD), may be alleviated.

In some embodiments, as shown in FIG. 1, the top surface 128 of the cover 120 has a length L and a width W. The ring 146 formed by the corner stiffeners 140 has a first ring thickness T1 and a second ring thickness T2. The first ring thickness T1 of the ring 146 is measured along a direction parallel to that of the length L of the top surface 128, and the first ring thickness T1 may substantially satisfy: $L*0.1 \leq T1 \leq L*0.2$. In some embodiments, the first ring thickness T1 may substantially satisfy: $T1=L*0.15$. The second ring thickness T2 of the ring 146 is measured along a direction parallel to that of the width W of the top surface 128, and the second ring thickness T2 may satisfy: $W*0.1 \leq T2 \leq W*0.2$. In some embodiments, the second ring thickness T2 may satisfy: $T2=W*0.15$. Such ring thicknesses T1 and T2 of the ring 146 formed by the corner stiffeners 140 may benefit the stiffening of the PoP structure.

In some embodiments, as shown in FIG. 2, the semiconductor device 130 may be a memory device, such as a FLASH, SRAM or DRAM device. The semiconductor device 130 may include a plurality of stacked memory dies. More memory dies may be mounted to increase the size of the memory provided, or alternatively a single memory die may be used. Other types of semiconductor devices 130 may be present on substrate 110 as well. In some embodiments, the upper semiconductor package 100 may include at least one bonding wire 160. The bonding wire 160 electrically connects the semiconductor device 130 to the bonding pad 116 on the substrate 110. However, in alternative arrangements, a bottom one of the stacked memory dies may be a "flip chip" and may be bonded to lands on the central portion of the substrate 110 using solder bumps, or copper connections. In some embodiments, a memory module of several vertically stacked dies may be formed as a component, using for example through via connections to couple the stacked memory dies to form a memory module, and the bottom memory die in the module may be flip chip mounted to the substrate 110.

In some embodiments, the substrate 110 has solder mask layers 111 and 113 on both the upper surface and the lower surface of the substrate 110. For example, the solder mask layers 111 and 113 may be respectively present on the upper and lower dielectric layers 114 of the substrate 110. The solder mask layer 111 may have the lower portions level with the conductive layer L1, and may, or may not, include upper portions higher than the conductive layer L1. In other words, the solder mask layer 111 has a thickness that is greater than that of the conductive layer L1. The solder mask layer 111 may cover some portions of the upper dielectric layer 114, while leaving other portions of the dielectric layer 114 exposed. In some embodiments, the solder mask layer 111 also covers some portions of the conductive layer L1. For example, the solder mask layer 111 covers some portions of bonding pads 116, while leaving other portions of the bonding pads 116 exposed for electrical connections with the semiconductor device 130 via the bonding wires 160. In some embodiments, the solder mask layer 113 may have the higher portions level with the conductive layer L3, and may, or may not, include lower portions lower than the conductive layer L3. In other words, the solder mask layer 113 has a thickness that is greater than that of the conductive layer L3. The solder mask layer 113 may cover some portions of the lower dielectric layer 114, while leaving other portions of the lower dielectric layer 114 exposed. In some embodiments, the solder mask layer 113 also covers some portions of the conductive layer L3. For example, the solder mask layer 113 covers some portions of conductive traces 118, while leaving other portions of the conductive traces 118 exposed for connecting the connectors 300.

In some embodiments, at least one of the solder mask layer 111 and 113 is a thin lacquer-like layer of polymer. At least one of the solder mask layer 111 and 113 may include, but is not limited to, an epoxy resin, a hardener, a color, a filler, and a solvent. For example, the epoxy resin may be, but is not limited to, o-Cresol novolac epoxy resin, phenol epoxy resin, or Diglycidylether Bisphenol A (DGEBA) epoxy resin. The active ingredient of the hardener may include the reaction product of an amine compound such as an imidazole or melamine. The filler may include, but is not limited to, silicon, aluminum, magnesium, calcium, titanium, or the like. The solvent may include, but is not limited to, glycol ether or the like.

As shown in FIG. 2, the lower semiconductor package 200 may form a BGA part of the PoP structure and includes a semiconductor device 230 therein. The semiconductor device 230 may be, without limitation, a microprocessor. Alternatives for semiconductor device 230 include the use of application specific integrated circuits ("ASICs"), digital signal processors ("DSPs"), a radio transceiver IC, or other functional device that performs selected desired functions. If the semiconductor device 230 is a processor or microprocessor, it can be seen that the semiconductor device 130 may be program storage, or cache, associated with the semiconductor device 230.

The lower semiconductor package 200 includes a substrate 210 that supports and electrical connects to the semiconductor device 230 and the connectors 300. This substrate 210 may be or includes a coreless substrate, which may reduce the voltage drop from the current-resistance in the current flow path and benefit thinning the lower semiconductor package 200 as well. Similar to the coreless substrate 110 of the upper semiconductor package 100, the coreless substrate 210 has layers of dielectric material separating conductive layers to form a multiple layer circuit board. For example, the coreless substrate 210 may include a plurality of conductive layers L4, L5, L6, L7 and L8, a plurality of conductive vias 212 and a plurality of dielectric layers 214. The dielectric layers 214 are arranged vertically. The conductive layers L4 to L8 are vertically arranged and spatially separated by the dielectric layers 214. The conductive vias 212 respectively penetrate through the vertically arranged dielectric layers 214, so that the conductive layers L4 to L8 can be electrically interconnected through the conductive vias 212. By such a configuration, conductive pads 216, which are portions of the top conductive layer L4, are connected to the conductive pads 218, which are portions of the bottom conductive layer L8. Each of the conductive via 212 electrically interconnects and may be in physical contact with the adjacent conductive layers. The conductive vias 212 may be formed as conductive pipes in some exemplary embodiments. The internal volumes of conductive vias 212 formed as the conductive pipes may be filled with dielectric filling, which may be a material selected from substantially the same candidate materials for forming the dielectric layers 214. In alternative embodiments, conductive vias 212 formed as pipes may include air gaps therein. Such conductive vias 212 vertically coupling the conductive layers L4 to L8 may be used to provide routing and mapping connections. The conductive vias 212 may be used to provide a vertical path for a signal through the substrate 210.

In some embodiments, the conductive layers L4 to L8 and the conductive vias 212 may include, but are not limited to, copper, aluminum, nickel, gold, or combinations thereof. In some embodiments, the dielectric layers 214 may include, but are not limited to, polypropylene (PP), polyethylene (PE), polymethyl methacrylate (PMMA), polyethylene terephthalate (PET), polycarbonates (PC), polyphenylene sulfide (PPS) or combinations thereof. Since the substrate 210 has no core therein, the thickness thereof can be reduced, and the path for the signal transmission can be shortened.

In some embodiments, the connectors 300 mechanically and electrically connect the conductive pads 216 of the substrate 210 and the conductive traces 118 of the substrate 110. For example, the connectors 300 may be conductive structures, such as solder balls, which may be in physical contact with the conductive traces 118 on the bottom of the substrate 110 and the conductive pads 216 on the top of the substrate 210. Since the connectors 300 provide mechanical connections to upper semiconductor package 100 and the substrate 210, the substrate 210 is in force communication with the cover 120 of the upper semiconductor package 100. Therefore, even if the coreless substrate 210 has low stiffness due to absence of the core, the corner stiffener 140 on the corner portion 122 of the cover 120 can alleviate warpage of coreless substrate 210, thereby alleviating warpage of the PoP structure. In the embodiment shown in FIG. 2, both the substrates 110 and 210 of the upper and lower semiconductor packages 100 and 200 are coreless substrates. In some embodiments, one of the substrates 110 and 210 may have a core therein. In some other embodiments, both the substrate 110 and 210 may have a core therein. For example, in some embodiments, the substrate 110, the substrate 210 or both of them may have a core layer of a woven glass reinforced epoxy resin. Other substrate materials may be used including, without limitation, BT resin, for example.

In some embodiments, the lower semiconductor package 200 includes connectors 240. The connectors 240 electrically and mechanically connect the conductive pads 216 of the top conductive layer L4 and the semiconductor device 230, respectively. For example, the connectors 240 may be solder balls, and these solder balls are in physical contact with the conductive pads 216 to form solder-on-pad (SOP) connections. In some other embodiments, the conductive pads 216 may be formed as traces, and the connectors 240 may include non-solder metal bumps. These non-solder metal bumps may include copper pillars, and may include one or more layers including nickel, gold, palladium, or other suitable materials. These non-solder metal bumps 240 and the conductive pads 216 may be bonded by solder to form bump-on-trace (BOT) connections. By the SOP connections or BOT connections formed by the connectors 240 and the top conductive layer L4 of the substrate 210, the semiconductor device 230 may be in electrical connection with the substrate 210, so as to be in electrical connection with the upper semiconductor package 100.

In some embodiments, the lower semiconductor package 200 may include external connectors 250. The external connectors 250 electrically and mechanically connect the bottom conductive layer L8 of the substrate 210 to an underlying board or device. For example, the external connectors 250 may be respectively attached to the conductive pads 218 of the substrate 210. The external connectors 250 may be solder connectors such as solder balls. These solder balls may be arranged in a grid pattern of rows and columns and may cover most of the bottom surface of the substrate 210. The external connectors 250 thus form a "ball grid array" or "BGA" and the bottom package 200 may be referred to as a BGA package.

In some embodiments, the substrate 210 has solder mask layers 211 and 213 on both the upper surface and the lower surface of the substrate 210. The solder mask layer 211 may have the lower portions level with the top conductive layer L4, and may, or may not, include upper portions higher than the conductive layer L4. In other words, the solder mask layer 211 has a thickness that is greater than that of the conductive layer L4. The solder mask layer 211 may cover some portions of the top dielectric layer 214, while leaving other portions of the top dielectric layer 214 exposed. In some embodiments, the solder mask layer 211 also covers some portions of the conductive layer L4. For example, the solder mask layer 211 covers some portions of conductive pads 216, while leaving other portions of the conductive pads 216 exposed to connect the connectors 240. The solder mask layer 213 may have the higher portions level with the bottom conductive layer L8, and may, or may not, include lower portions lower than the conductive layer L8. In other words, the solder mask layer 213 has a thickness that is greater than that of the conductive layer L8. The solder mask layer 213 may cover some portions of the bottom dielectric layer 214, while leaving other portions of the bottom dielectric layer 214 exposed. In some embodiments, the solder mask layer 213 also covers some portions of the bottom conductive layer L8. For example, the solder mask layer 213 covers some portions of conductive pads 218, while leaving other portions of the conductive pads 218 exposed to connect the external connectors 250.

In some embodiments, the solder mask layer 211, 213 or both of them are thin lacquer-like layers of polymer. The solder mask layer 211, 213 or both of them may include, but is not limited to, an epoxy resin, a hardener, a color, a filler, and a solvent. For example, the epoxy resin may be, but is not limited to, o-Cresol novolac epoxy resin, phenol epoxy resin, or Diglycidylether Bisphenol A (DGEBA) epoxy resin. The active ingredient of the hardener may include the reaction product of an amine compound such as an imidazole or melamine. The filler may include, but is not limited to, silicon, aluminum, magnesium, calcium, titanium, or the like. The solvent may include, but is not limited to, glycol ether or the like.

In some embodiments, the semiconductor package assembly may further include an underfill layer 400. The underfill layer 400 is present in the space between the upper semiconductor package 100 and the substrate 210 of the lower semiconductor package 200. The underfill layer 400 may be exemplarily dispensed as a liquid using a capillary underfill ("CUF") approach. A resin or epoxy liquid is flowed beneath the substrate 110 of the upper semiconductor package 100 and fills the space between the substrate 110 and the substrate 210. The resin or epoxy liquid is further flow beneath the semiconductor device 230 and fills the space between the semiconductor device 230 and the substrate 210. Room temperature, UV, or thermal curing may be used to cure the underfill layer 400. The underfill layer 400 may provide mechanical strength and stress relief to the upper and lower semiconductor packages 100 and 200.

Figure 3:
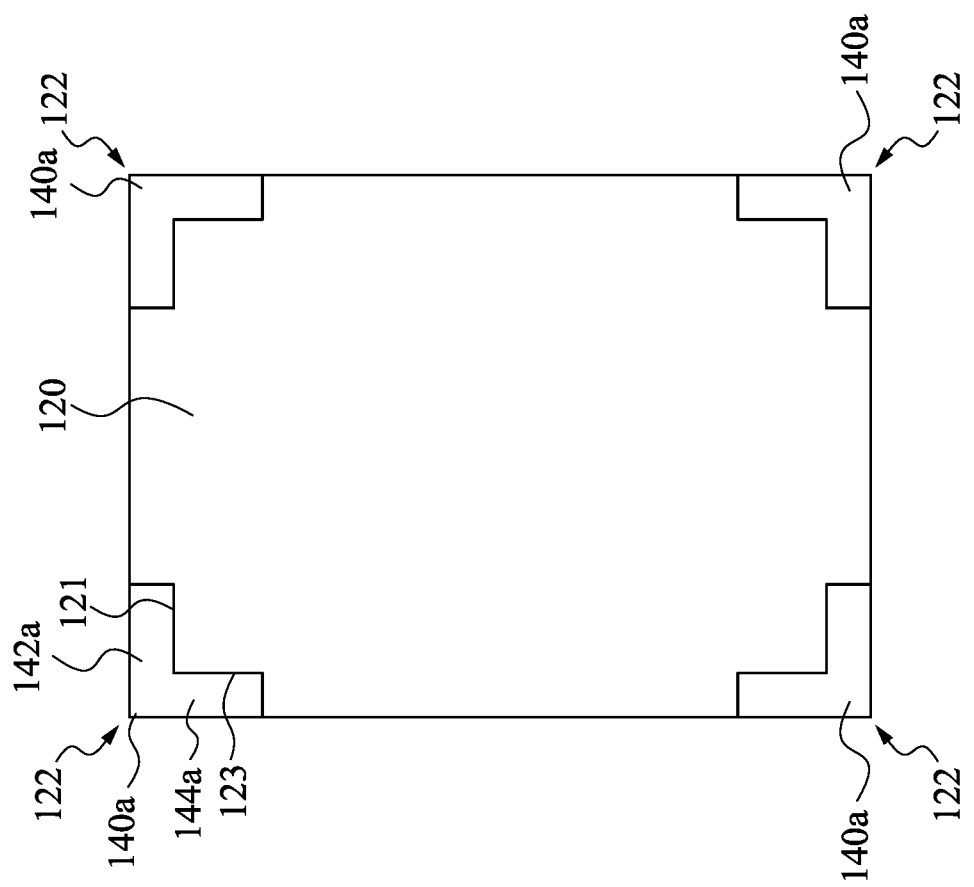
FIG. 3 is a top view of a semiconductor package assembly in accordance with some embodiments of the present disclosure.

FIG. 3 is a top view of a semiconductor package assembly in accordance with some embodiments of the present disclosure. As shown in FIG. 3, the difference between this embodiment and which is shown in FIG. 2 at least includes that the corner stiffeners 140a are not connected to form a ring. Instead, the corner stiffeners 140a are spatially separated from each other. More particularly, the corner stiffeners 140a are respectively present on the corners 122 of the cover 120. Each of the corner stiffeners 140 includes portions 142a and 144a respectively present on non-parallel surfaces 121 and 123 of the cover 120. The portions 142a and 144a of a corner stiffener 140 are connected, adjoined or integrally formed to form an L-shaped stiffener on the corner 122, while the L-shaped stiffeners are not connected with each other.

Figure 4:
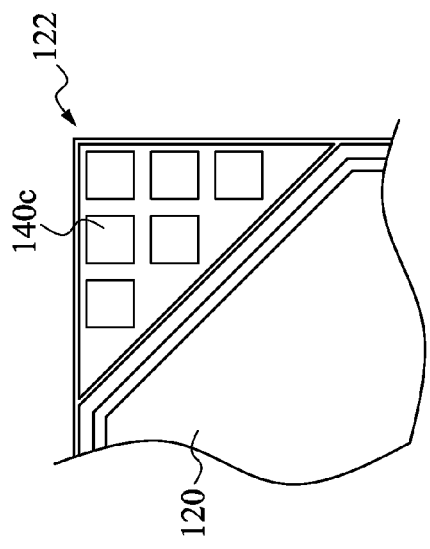
FIGS. 4 to 7 are fragmentary top views of semiconductor package assemblies in accordance with some embodiments of the present disclosure.
Figure 5:
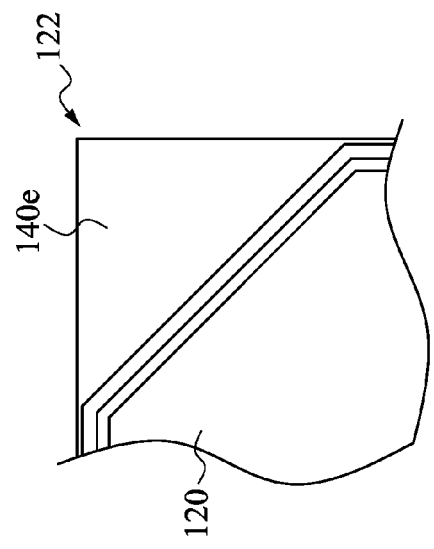
Figure 6:
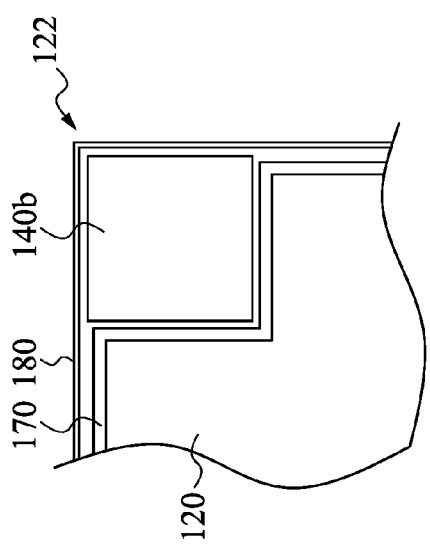
Figure 7:
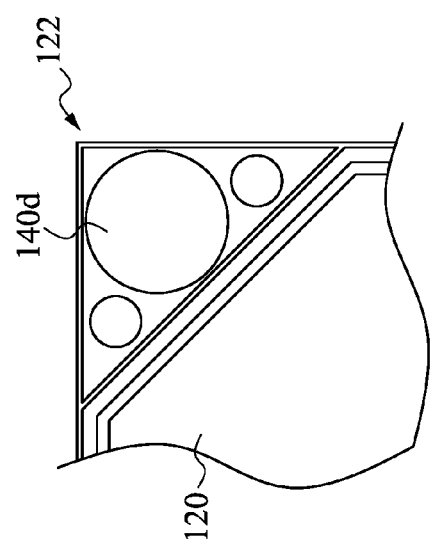

FIG. 4 is a fragmentary top view of a semiconductor package assembly in accordance with some embodiments of the present disclosure. As shown in FIG. 4, the difference between this embodiment and which is shown in FIG. 3 at least includes that the corner stiffener 140b may be a square stiffener, rather than the L-shaped stiffener. The square stiffener 140b is present on the corner portion 122 of the cover 120. In addition to the square stiffener 140b, the semiconductor package assembly may further include stiffeners 170 and 180 that are present on the corner portion 122 as well. The square stiffener 140b is present between the stiffeners 170 and 180. At least a portion of the stiffener 170 is conformal to adjacent sides of the square stiffener 140b, and at least a portion of the stiffener 180 is conformal to other adjacent sides of the square stiffener 140b. By such a configuration, the corner portion 122 of the cover 120 can be stiffened. FIGS. 5, 6 and 7 are fragmentary top views of some other semiconductor package assemblies in accordance with some embodiments of the present disclosure. As shown in FIG. 5, the difference between this embodiment and which is shown in FIG. 4 at least includes that there are several corner stiffeners 140c formed as squares and present on the corner portion 122 of the cover 120. These square stiffeners 140c are spatially separated from each other. As shown in FIG. 6, the difference between this embodiment and which is shown in FIG. 5 at least includes that there are several corner stiffeners 140d formed as circles and present on the corner portion 122 of the cover 120. As shown in FIG. 7, the difference between this embodiment and which is shown in FIG. 4 at least includes that the corner stiffener 140e is formed as a triangle, not as a square. Such corner stiffeners 140c, 104d and 140e depicted in FIGS. 5-7 can stiffen the corner portion 122 of the cover 120.

Figure 8:
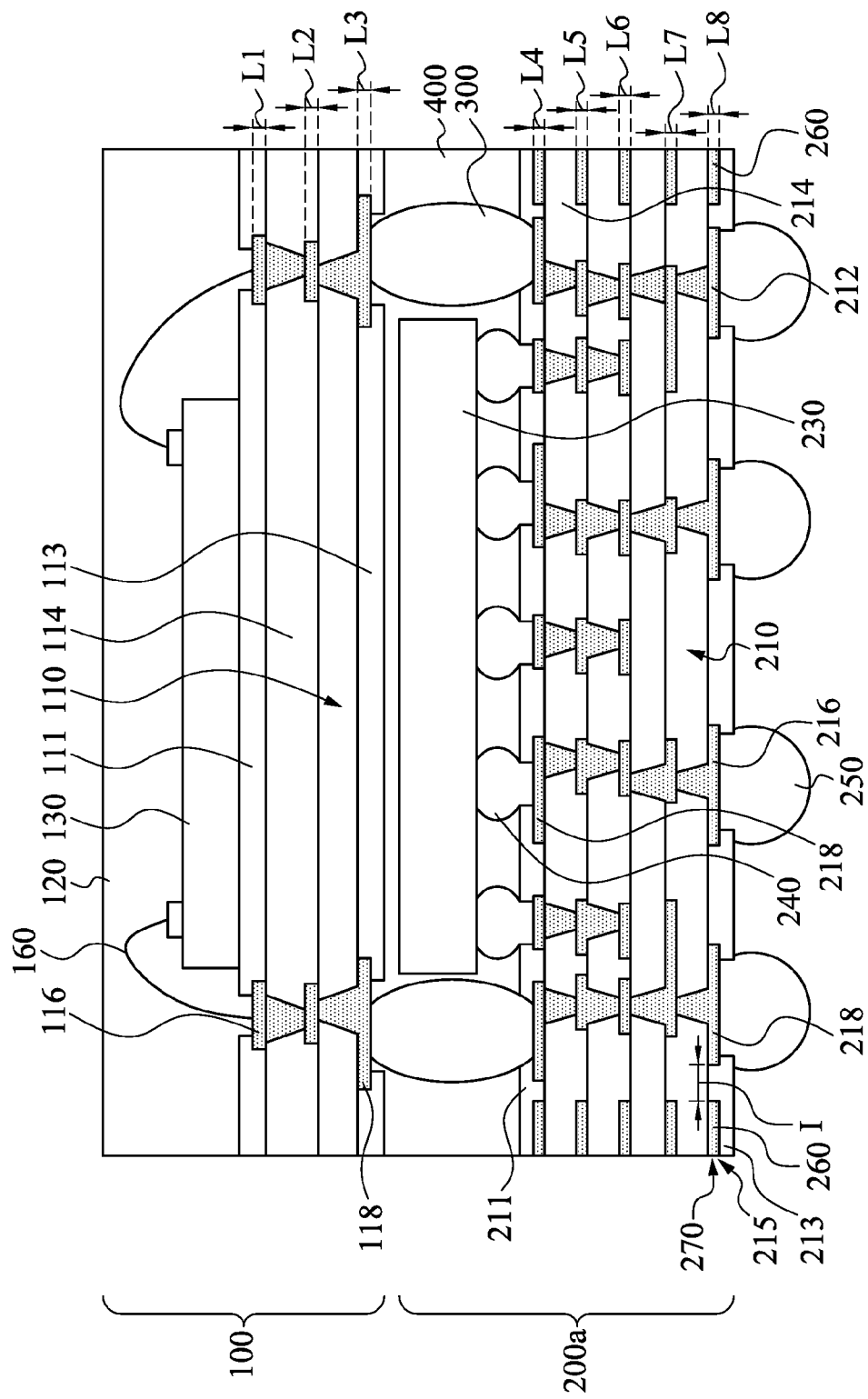
FIG. 8 is a cross-sectional view of a semiconductor package assembly in accordance with some embodiments of the present disclosure.

FIG. 8 is a cross-sectional view of a semiconductor package assembly in accordance with some embodiments of the present disclosure. The difference between this embodiment and which is shown in FIG. 2 at least includes that the corner stiffener is present on the lower semiconductor package 200a, not the upper semiconductor package 100. In particular, the lower semiconductor package 200a has at least one corner stiffener 260 therein, the substrate 210 of the lower semiconductor package 200a includes at least one corner portion 215, and the corner stiffener 260 is present on the corner portion 215 of the substrate 210. The corner stiffener 260 is stiffer than the corner portion 215 of the substrate 210. In other words, the corner stiffener 260 has stiffness greater than that of the corner portion 215 of the substrate 210, so that the lower semiconductor package 200a can be stiffened to have high enough stiffness even if the substrate 210 is a coreless substrate in some embodiments. In other words, even if the coreless substrate 210 has low stiffness due to absence of the core, the corner stiffener 260 can stiffen the lower semiconductor package 200a, thereby alleviating warpage of the PoP structure.

In some embodiments, there are plural corner stiffeners 260, and these corner stiffeners 260 are connected to form a ring 270 that surrounds at least a portion of the substrate 210, which may further improve the stiffening of the PoP structure. In some embodiments, the corner stiffener 260 is buried in the substrate 210. For example, the corner stiffener 260 may be buried in the stacked dielectric layers 214. For example, the corner stiffener 260 may be substantially level with one of the conductive layers L4 to L8, in which the conductive layers L4 to L8 are vertically arranged, such as arranged along an arrangement direction of the substrate 210 and the cover 120. Since the conductive layers L4 to L8 are at least partially buried in the substrate 210, the corner stiffener 260 can be buried in the substrate 210. In some embodiments, the corner stiffener 260 can be formed along with the forming process of one of the conductive layers L4 to L8, so as to reduce the manufacturing cost. For example, when the bottom conductive layer L8 is formed, the corner stiffener 260 can be formed as well, and the corner stiffener 260 and the bottom conductive layer L8 can be made of substantially the same materials. In other words, the bottom conductive layer L8 and the corner stiffener 260 can be formed on the bottom dielectric layer 214. For example, the bottom conductive layer L8 and the corner stiffener 260 can be formed by a copper plating process performed to the bottom dielectric layer 214. When the corner stiffeners 260 are connected to form the ring 270, the ring 270 can surround the conductive layer L8 that the ring 270 is substantially level with.

In some embodiments, there may be several corner stiffeners 260 vertically arranged and respectively and substantially level with the conductive layers L4 to L8, so as to further improve the stiffening of the PoP structure. The vertically arranged corner stiffeners 260 can be respectively formed along with the forming of the conductive layers L4 to L8, so as to reduce the manufacturing cost. In some embodiments, the conductive layers L4 to L8 can be respectively and substantially level with different rings 270 that are formed by the corner stiffeners 260. In other words, there may be several vertically arranged rings 270 formed by the corner stiffeners 260 respectively and substantially level with the conductive layers L4 to L8, and the conductive layers L4 to L8 are respectively surrounded by the rings 270. By such a configuration, warpage of the PoP structure can be further alleviated.

In some embodiments, the corner stiffener 260 is insulated from the conductive layers L4 to L8, so as to prevent an undesirable electrical connection to the conductive layers L4 to L8. For example, the corner stiffener 260 and the conductive layers L4 to L8 can be insulated by the dielectric layers 214, the solder mask layer 211 or the solder mask layer 213. More particularly, at least one of the dielectric layers 214 is present between the corner stiffener 260 and one of the conductive layers L4 to L8, and an interval I between the corner stiffener 260 and the conductive layer that the corner stiffener 260 is substantially level with, such as the conductive layer L8, may ranges from about 30 um to 100 um. In some embodiments, the corner stiffener 260 is stiffer than the dielectric layer 214, so that warpage of the PoP structure can be alleviated. In other words, the corner stiffener 260 is stiffener than a dielectric material of the substrate 210 to resist warpage of the PoP structure.

In some embodiments, the corner stiffeners 260 can be formed as the corner stiffeners 140a, 140b, 140c, 140d or 140e as shown in FIGS. 3 to 7. These types of corner stiffeners can also stiffen the PoP structure as they are buried in the substrate 210 of the lower semiconductor package 200a. In some embodiments, the substrate 110 of the upper semiconductor package 100 can also include at least one corner stiffener on the corner portion thereof, so as to further improve the stiffening of the PoP structure. In some other embodiments, the substrate 210 of the lower semiconductor package 200 does not include the corner stiffener therein, while the substrate 110 of the upper semiconductor package 100 includes the corner stiffener therein.

Figure 9:
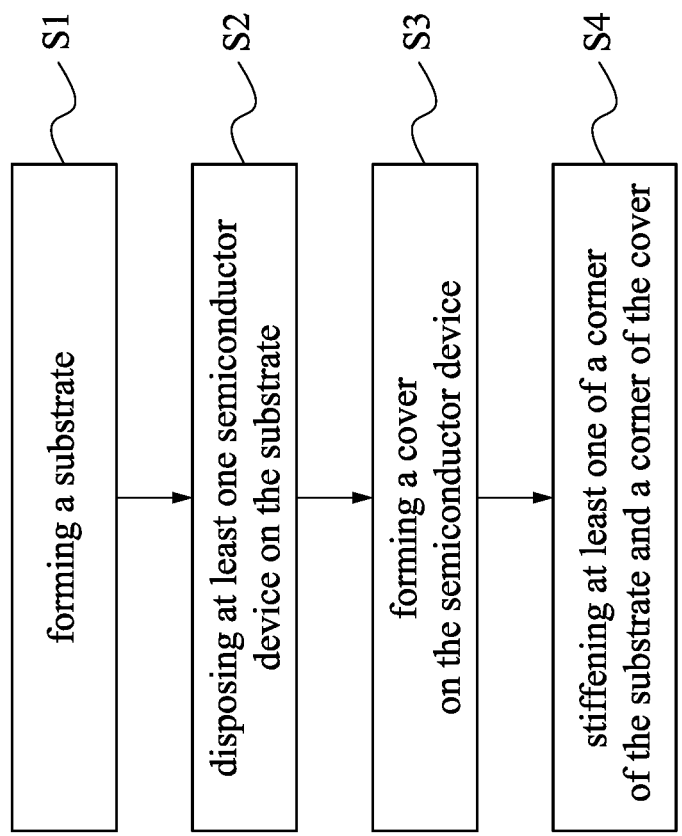
FIG. 9 is a flow chart of a method of forming a semiconductor package.

FIG. 9 is a flow chart of a method of forming a semiconductor package. Step S1 of the method includes forming a substrate, such as the substrate 110 of the upper semiconductor package 100 or the substrate 210 of the lower semiconductor package 200. Step S2 of the method includes disposing at least one semiconductor device on the substrate, such as disposing the semiconductor device 130 on the substrate 110 or disposing the semiconductor device 230 on the substrate 210. Step S3 includes forming a cover on the semiconductor device, such as forming the cover 120 on the semiconductor device 130. Step S4 includes stiffening at least one of a corner portion of the substrate and a corner portion of the cover. For example, Step S4 may be performed by forming a corner stiffener on the corner portion of the substrate 110, the corner portion of the substrate 210, the corner portion of the cover 120 or combinations thereof, and such a corner stiffener is stiffer than the corner portion of the substrate 110, the corner portion of the substrate 210, the corner portion of the cover 120 or combinations thereof. The forming the corner stiffener on the cover may include recessing the cover, for example, by laser cutting, and adhering the corner stiffener on the recess of the cover formed by the laser cutting. The forming the corner stiffener on the substrate 110 or 210 may be performed along with the forming process of the conductive layers of the substrate 110 or 210. By the stiffening the corner portion, warpage of the semiconductor package can be alleviated.

In some embodiments, since at least one corner stiffener is present on and stiffer than the corner portion of the substrate, the corner portion of the cover or both of them, warpage of the semiconductor package can be alleviated. In some embodiments, since at least one corner stiffener is present on the corner portion of the upper semiconductor package, the corner portion of the lower semiconductor package or both of them, warpage of the stacked upper and lower semiconductor packages can be alleviated.

According to some embodiments, a semiconductor package includes a cover, a substrate, at least one semiconductor device and at least one corner stiffener. The cover has at least one corner portion. The substrate is in force communication with the cover. The substrate has at least one corner portion. The semiconductor device is present between the cover and the substrate. The corner stiffener is present on at least one of the corner portion of the cover and the corner portion of the substrate.

According to some embodiments, a semiconductor package assembly includes a first semiconductor package, a semiconductor package and at least one corner stiffener. The first semiconductor package has at least one corner portion. The second semiconductor package is in force communication with the first semiconductor package, the second semiconductor package has at least one corner portion. The corner stiffener is present on at least one of the corner portion of the first semiconductor package and the corner portion of the second semiconductor package.

According to some embodiments, a method of forming a semiconductor package includes forming a substrate, disposing at least one semiconductor device on the substrate, forming a cover on the semiconductor device, and stiffening at least one of a corner portion of the substrate and a corner portion of the cover.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a cover having at least one corner portion;
a substrate in force communication with the cover, the substrate having at least one corner portion;
at least one semiconductor device present between the cover and the substrate; and
at least one corner stiffener present on at least one of the corner portion of the cover and the corner portion of the substrate, wherein the cover has at least one recess thereon, and the at least one corner stiffener is present in the at least one recess.

2. The semiconductor package of claim 1, wherein a plurality of the corner stiffeners are connected to form a ring.

3. The semiconductor package of claim 1, wherein the at least one recess is annular-shaped.

4. The semiconductor package of claim 1, wherein the cover has a top surface distal to the substrate, and the at least one recess is formed on the top surface of the cover.

5. The semiconductor package of claim 4, wherein the cover is a molding compound, and the at least one corner stiffener is a conductive structure present in the at least one recess of the molding compound.

6. The semiconductor package of claim 5, wherein the conductive structure is insulated from the semiconductor device.

7. The semiconductor package of claim 1, wherein the substrate is a coreless substrate.

8. A method of forming a semiconductor package, comprising:
forming a substrate;
disposing at least one semiconductor device on the substrate;
forming a cover on the semiconductor device; and
stiffening at least one of a corner portion of the substrate and a corner portion of the cover,
wherein the forming the cover comprises forming a molding compound on the at least one semiconductor device,
wherein the stiffening comprises forming at least one recess in the molding compound, and forming a corner stiffener in the at least one recess.

9. The method of claim 8, wherein the forming the corner stiffener comprises:
adhering the corner stiffener to the at least one recess.

10. The method of claim 8, wherein the forming the substrate comprises:
forming at least one dielectric layer; and
forming at least one conductive layer and at least one corner stiffener on the dielectric layer.

11. The semiconductor package of claim 1, wherein the at least one corner stiffener is embedded in the at least one recess.

12. The semiconductor package of claim 1, wherein the cover is a molding compound, and the at least one corner stiffener is embedded in the molding compound.

13. The semiconductor package of claim 1, further comprising:
an adhesive between a surface of the at least one recess and the at least one corner stiffener.

14. The semiconductor package of claim 1, wherein the at least one corner stiffener is an L-shaped structure.

15. The semiconductor package of claim 1, wherein a plurality of the corner stiffeners are separated.

16. A semiconductor package, comprising:
a cover having at least one corner portion;
a substrate coupled to the cover, the substrate having at least one corner portion;
a semiconductor device present between the cover and the substrate; and
a corner stiffener present on each of the at least one corner portion of the cover and the at least one corner portion of the substrate,
wherein the substrate comprises a plurality of conductive layers arranged along an arrangement direction of the substrate and the cover, wherein the corner stiffener is substantially level with one of the conductive layers.

17. The semiconductor package of claim 16, wherein a plurality of the corner stiffeners are connected to form a ring, wherein said one of the conductive layers that is substantially level with the corner stiffeners is surrounded by the ring.

18. The semiconductor package of claim 16, wherein the corner stiffener is insulated from the conductive layers.

19. The semiconductor package of claim 16, wherein the corner stiffener is buried in the substrate.

20. The semiconductor package of claim 16, further comprising:
a plurality of metal connectors connecting a plurality of the substrates, wherein the semiconductor device is between the metal connectors.

* * * * *